United States Patent [19]

Swanson

[11] Patent Number: 4,933,021

[45] Date of Patent: Jun. 12, 1990

[54] MONOLITHIC SERIES-CONNECTED SOLAR CELLS EMPLOYING SHORTED P-N JUNCTIONS FOR ELECTRICAL ISOLATION

[75] Inventor: Richard M. Swanson, Los Altos, Calif.

[73] Assignee: Electric Power Research Institute, Palo Alto, Calif.

[21] Appl. No.: 272,129

[22] Filed: Nov. 14, 1988

[51] Int. Cl.[5] ............... H01L 27/14; H01L 31/06
[52] U.S. Cl. .................................. 136/249; 437/2
[58] Field of Search ........................... 136/249 MS

[56] References Cited

U.S. PATENT DOCUMENTS

| | | | |
|---|---|---|---|
| 4,166,918 | 9/1979 | Nostrand et al. | 136/243 |
| 4,167,015 | 9/1979 | Hanak | 357/16 |
| 4,227,942 | 10/1980 | Hall | 136/255 |
| 4,239,810 | 12/1980 | Alameddine et al. | 427/75 |
| 4,278,473 | 7/1981 | Borden | 136/249 |
| 4,330,680 | 5/1982 | Goetzberger | 136/247 |
| 4,347,264 | 8/1982 | Lindmayer | 430/314 |
| 4,367,368 | 1/1983 | Wolf | 136/255 |
| 4,463,216 | 7/1984 | Nakano et al. | 136/256 |
| 4,512,073 | 4/1985 | Hsu | 437/187 |
| 4,533,933 | 8/1985 | Pellegrini et al. | 357/15 |
| 4,557,037 | 12/1985 | Hanoka et al. | 437/2 |
| 4,585,492 | 4/1986 | Weinberg et al. | 437/247 |
| 4,612,698 | 9/1986 | Gonsiorawski et al. | 437/2 |
| 4,665,277 | 5/1987 | Sah et al. | 136/255 |
| 4,667,060 | 5/1987 | Spitzer | 136/255 |

OTHER PUBLICATIONS

J. C. Evans, Jr. et al., *Conference Record, 14th IEEE Photovoltaic Specialists Conference* (1980), pp. 58–62.
R. M. Swanson et al., *IEEE Trans. Electron Dev.*, vol. ED-31, May 1984, pp. 661–664.
EPRI AP-2859 Project 790-2, Interim Report, May 1983.
W. D. Eades et al., *J. Electrochem. Soc.*, vol. 131, Dec. 1984, pp. 3018–3020.
R. M. Swanson, *Solar Cells*, vol. 17, pp. 85–118 (1986).
R. A. Sinton et al., *IEEE Electron Device Letters*, vol. EDL-6, Aug. 1985, pp. 405–407.
R. A. Sinton et al., *IEEE Electron Device Letters*, vol. EDL-7, Oct. 1986, pp. 567–569.
R. A. Sinton, EPRI Contract No. RP-790-2, Feb. 1987.

*Primary Examiner*—Aaron Weisstuch
*Attorney, Agent, or Firm*—Flehr, Hohbach, Test, Albritton & Herbert

[57] ABSTRACT

Electrical isolation between cells in a dual metal layer contact solar cell or an interdigitated contact solar cell structure is provided by forming a plurality of p-n junctions in the semiconductor substrate of the structure between cells and shorting the p-n junctions by the metallization serially interconnecting adjacent cells. The shorted p-n junctions function as minority carrier traps for minority carriers flowing between the cells.

6 Claims, 1 Drawing Sheet

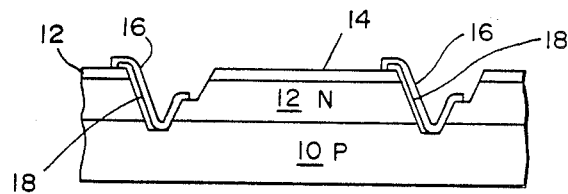
(PRIOR ART)
FIG.—1
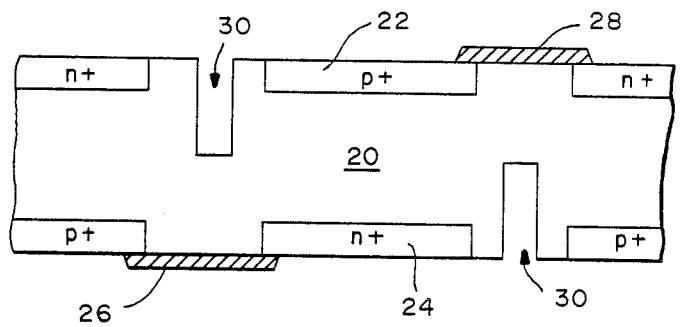
(PRIOR ART)
FIG.—2
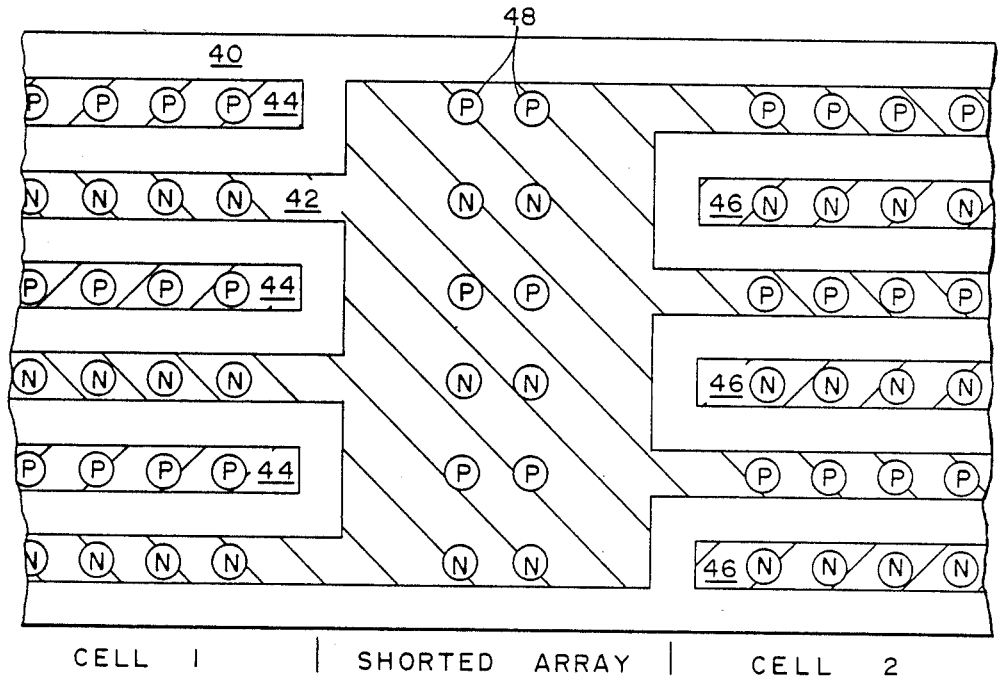
FIG.—3

//4,933,021

MONOLITHIC SERIES-CONNECTED SOLAR CELLS EMPLOYING SHORTED P-N JUNCTIONS FOR ELECTRICAL ISOLATION

BACKGROUND OF THE INVENTION

This invention relates generally to monolithic series-connected solar cells, and more particularly the invention relates to electrically isolating adjacent cells in such a structure.

The invention is related to the invention in copending application Serial No. 272,105, filed Nov. 14, 1988, for "Solar Cell Having Interdigitated Contacts and Internal Bypass Diodes".

The semiconductor solar cell comprises a plurality of p and n conductivity-type regions in a semiconductor body which generate a voltage potential and/or a current when electron-hole pairs are created in the semiconductor body in response to impinging radiation, and the holes and electrons migrate to the p-doped region and n-doped region, respectively. Because of the small voltage generated in each cell, for example 0.8 volts open circuit for a silicon concentrator cell, cells are serially connected to achieve higher operating voltages. In monolithic structures where the cells share a common substrate, electrical isolation of the cells must be provided.

Heretofore a number of monolithic solar cell configurations have been provided for serially connecting the individual cells. Borden U.S. Patent No. 4,278,431 proposes a mesa structure for each cell with the mesa physically separating epitaxial layer regions which comprise the active portions of each cell. The cells are then serially connected by metal plating formed over oxide isolation in the grooved regions between mesas. Goetzberger U.S. Pat. No. 4,330,680 uses physical shaping to increase electrical resistance of a semiconductor substrate between cells and thereby provide enhanced electrical isolation. P and n regions for each cell are formed on opposing sides of the substrate, and grooves are chemically etched from alternate sides of the substrate to increase resistance of the substrate between cells.

The interdigitated solar cell has p and n regions formed in alternating rows in one surface of a substrate with metal contacts provided contacting all of the doped regions in one row and with all rows of like doped regions being connected in parallel. Electrical isolation between cells in the interdigitated solar cell depends on the resistance of the high-resistivity semiconductor substrate.

SUMMARY OF THE INVENTION

An object of the present invention is an improved isolation of serially-connected cells in a monolithic semiconductor solar cell structure.

Another object of the invention is an interdigitated solar cell in which adjacent cells share common metal contacts and in which electrical isolation is enhanced.

A feature of the invention is the use of shorted p-n junctions between cells with metallization for serially connecting the cells, shorting the p-n junctions, and thereby absorbing minority carriers flowing between the adjacent cells.

Briefly, in accordance with a preferred embodiment of the invention, a high-resistivity silicon substrate has a plurality of cells formed in one surface thereof, each cell having alternate rows of p-type and n-type regions formed in the one surface, with a first metal contact structure contacting all p-type regions and a second metal contact structure contacting all n-type regions. The first and second metal structures serially connect each cell with adjacent cells A plurality of p-n junctions is provided between cells with the metallization serially connecting the cells contacting and shorting the p-n junctions whereby the shorted p-n junctions absorb minority carriers flowing between the adjacent cells. Thus, electrical isolation between cells is provided both by the high-resistivity silicon substrate portion between cells and by the shorted p-n junctions which absorb minority carriers The invention and objects and features thereof will be more readily apparent from the following detailed description and appended claims when taken with the drawing.

BRIEF DESCRIPTION OF THE DRAWING

FIG. 1 is a section view of a monolithic series-connected solar cell in accordance with the prior art.

FIG. 2 is a section view of another embodiment of a monolithic series-connected solar cell in accordance with the prior art.

FIG. 3 is a top plan view of a monolithic series-connected interdigitated silicon solar cell in accordance with one embodiment of the invention.

DETAILED DESCRIPTION OF ILLUSTRATIVE EMBODIMENT

Referring now to the drawing, FIG. 1 is a section view of a monolithic series-connected solar cell structure in accordance with the prior art as disclosed in Borden U.S. Pat. No. 4,278,431, supra. In this embodiment the solar cell comprises an insulating substrate 10 of gallium arsenide with an n-doped epitaxial layer 12 formed thereon. The top surface of the epitaxial layer 12 is then doped to form a p-type surface layer 14.

The epitaxial layer 12 and surface layer 14 are then etched to define a plurality of mesas, with each mesa forming an active solar cell. Each cell is then electrically isolated from adjacent cells by the groove therebetween. The individual cells are serially interconnected by a metal layer 16 formed over an insulating layer 18 on the side of each mesa, with the p-region of one cell being electrically connected to the n-epitaxial region of an adjacent cell through the metal layer 16. Such structure is complex in fabrication and requires that the solar cell be fabricated on a semi-insulating substrate. Further, the structure is applicable only to 3-5 materials such as gallium arsenide.

FIG. 2 is a section view of another embodiment of a monolithic series-connected solar cell in accordance with Goetzberger, supra. In this embodiment each cell is formed by doped regions in opposing surfaces of a semiconductor substrate 20 such as the p+ region 22 and the n+ region 24 of one cell. The cell is interconnected with adjacent cells through the metallization 26 and 28. To facilitate electrical isolation between the adjacent cells, the grooves 30 are etched in opposing surfaces of the substrate 20 to eliminate parasitic injection currents between adjacent cells. Goetzberger also suggests using doping with gold or other recombination centers, but notes that such dopants are extraordinarily harmful for solar cells. In addition, Goetzberger suggests the use of protective rings around each cell structure.

In accordance with the present invention, a plurality of shorted p-n junctions is provided between adjacent cells to absorb minority carriers that flow between the cells, thus lessening or preventing any shunting effect between the cells. FIG. 3 is a top plan view of an interdigitated monolithic silicon cell embodying the invention. A portion of a silicon substrate 40 is shown with a cell 1 and a cell 2 interconnected by metallization with a shorted array therein. Cell 1 includes a plurality of rows of doped regions of alternating p and n type conductivity. All of the n-type conductivity regions are interconnected by a first metallization pattern 42 and all of the p-type doped regions are interconnected by a metallization pattern 44. The metallization layer 42 interconnects cell 1 to cell 2 with the metallization 42 contacting p-doped regions in cell 2. Another metallization 46 contacts all of the n-doped regions of cell 2.

In accordance with the invention, the intermediate portion of layer 42 which connects the two cells also electrically contacts a plurality of p-n junctions defined by the alternating doped regions shown generally at 48. The shorted p-n junctions absorb minority carriers that flow between cells, thus reducing the shunting effect of the substrate between the two cells. The structure is simple and fabrication thereof is compatible with the existing process steps in making an interdigitated monolithic solar cell without introducing additional process steps. The doped regions of the shorted array are illustrated as alternating rows of a pair of doped regions of like conductivity type; each row can have doped regions of opposite conductivity type whereby the p-n junction is arranged within each row rather than between rows.

The invention is applicable to a solar cell using a dual metal back surface interconnection as well as in the described solar cell using interdigitated contacts. Thus, while the invention has been described with reference to a preferred embodiment, various modifications and applications may occur to those skilled in the art without departing from the true spirit and scope of the invention as defined by the appended claims.

I claim:

1. A solar cell structure comprising
    a semiconductor substrate,
    a plurality of cells formed in one surface of said substrate, each cell formed in one surface of said substrate, each cell having alternate rows of p-type and n-type regions formed in said one surface, a first metal contact structure contacting all p-type regions and a second metal contact structure contacting all n-type regions, said first and second metal contact structures serially connecting a cell with adjacent cells, and p1 an array of shorted p-n junctions between adjacent cells in contact with said first and second metal contact structures serially connecting adjacent cells and shorted thereby, whereby said shorted p-n junctions function as minority carrier traps between adjacent cells.

2. The solar cell structure as defined by claim 1 wherein said first and second metal contact structures each contact opposite conductivity type regions in adjacent cells.

3. The solar cell structure as defined by claim 1 wherein said semiconductor substrate comprises silicon.

4. In a solar cell structure having a plurality of contacts with at least a first contact contacting doped regions of a first conductivity type and at least a second contact contacting doped regions of opposite conductivity type, said first and second contacts serially connecting said solar cell with adjacent cells formed in a common semiconductor substrate, means for increasing electrical isolation between adjacent cells comprising
    a first plurality of doped regions of one conductivity type and a second plurality of doped regions of opposite conductivity type, said first and second pluralities of doped regions cooperatively forming p-n junctions between adjacent cells, and
    means for shorting said p-n junctions whereby said p-n junctions function as minority carrier traps.

5. The means for increasing electrical isolation as defined by claim 4 wherein said means for shorting said p-n junctions comprises one of said contacts in said solar cell structure.

6. The means as defined by claim 5 wherein said first and second contacts are interdigitated contacts.

* * * * *